United States Patent
Nam et al.

(10) Patent No.: US 9,733,579 B2
(45) Date of Patent: *Aug. 15, 2017

(54) TOOLING CONFIGURATION FOR ELECTRIC/MAGNETIC FIELD GUIDED ACID PROFILE CONTROL IN A PHOTORESIST LAYER

(71) Applicant: Applied Materials, Inc., Santa Clara, CA (US)

(72) Inventors: Sang Ki Nam, Danville, CA (US); Peng Xie, Fremont, CA (US); Qiwei Liang, Fremont, CA (US); Ludovic Godet, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 128 days.

This patent is subject to a terminal disclaimer.

(21) Appl. No.: 14/581,632

(22) Filed: Dec. 23, 2014

(65) Prior Publication Data

US 2016/0109813 A1   Apr. 21, 2016

Related U.S. Application Data

(60) Provisional application No. 62/064,456, filed on Oct. 15, 2014.

(51) Int. Cl.
G03F 7/38 (2006.01)
G03F 7/20 (2006.01)
G03F 7/40 (2006.01)

(52) U.S. Cl.
CPC .......... *G03F 7/70733* (2013.01); *G03F 7/38* (2013.01); *G03F 7/40* (2013.01); *G03F 7/70325* (2013.01)

(58) Field of Classification Search
CPC .................................................... G03F 7/3007
USPC .................................................. 430/330, 328
See application file for complete search history.

(56) References Cited

U.S. PATENT DOCUMENTS

| | | |
|---|---|---|
| 5,258,266 A | 11/1993 | Tokui et al. |
| 6,242,164 B1 | 6/2001 | Choi et al. |
| 6,686,132 B2 | 2/2004 | Cheng et al. |
| 7,374,867 B2 | 5/2008 | Bristol et al. |
| 7,780,366 B2 * | 8/2010 | Ogata ............... G03F 7/162 355/27 |

(Continued)

FOREIGN PATENT DOCUMENTS

KR   20140036116 A   3/2014

OTHER PUBLICATIONS

International Search Report and Written Opinion PCT/US2015/049652, dated Dec. 21, 2015, Consists of 11 pages.

*Primary Examiner* — Daborah Chacko Davis
(74) *Attorney, Agent, or Firm* — Patterson + Sheridan, LLP (57) ABSTRACT

A method of processing a substrate is disclosed herein. The method includes applying a photoresist layer comprising a photoacid generator to a substrate, wherein a first portion of the photoresist layer has been exposed unprotected by a photomask to a radiation light in a lithographic exposure process. The method also includes applying an electric field to alter movement of photoacid generated from the photoacid generator substantially in a vertical direction, wherein the electric field is applied by a first alternating pair of a positive voltage electrode and a negative voltage electrode and a second alternating pair of a positive voltage electrode and a negative voltage electrode.

15 Claims, 8 Drawing Sheets

(56) References Cited

U.S. PATENT DOCUMENTS

| | | |
|---|---|---|
| 8,097,402 B2 | 1/2012 | Scheer et al. |
| 9,377,692 B2 * | 6/2016 | Xie .......................... G03F 7/38 |
| 2007/0000613 A1 | 1/2007 | Pau et al. |
| 2009/0142926 A1 | 6/2009 | Dai et al. |
| 2009/0179366 A1 * | 7/2009 | Herchen ........... H01L 21/67126 269/21 |
| 2014/0193755 A1 | 7/2014 | Wise et al. |

* cited by examiner

TOOLING CONFIGURATION FOR ELECTRIC/MAGNETIC FIELD GUIDED ACID PROFILE CONTROL IN A PHOTORESIST LAYER

CROSS-REFERENCE TO RELATED APPLICATIONS

This application claims the priority benefit of U.S. provisional patent application Ser. No. 62/064,456, filed Oct. 15, 2014 and titled "Tooling Configuration for Electric/Magnetic Field Guided Acid Profile Control in a Photoresist Layer." The subject matter of this related application is hereby incorporated herein by reference.

BACKGROUND

Field

The present disclosure generally relates to methods and apparatuses for processing a substrate, and more specifically to methods and apparatuses for controlling photoresist line edge/width roughness.

Description of the Related Art

Integrated circuits have evolved into complex devices that can include millions of components (e.g., transistors, capacitors and resistors) on a single chip. Photolithography may be used to form components on a chip. Generally the process of photolithography involves a few basic stages. Initially, a photoresist layer is formed on a substrate. The photoresist layer may be formed by, for example, spin-coating. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Excess solvent may then be removed in a pre-exposure bake process.

In an exposure stage, a photomask or reticle may be used to selectively expose certain regions of a photoresist layer disposed on the substrate to electromagnetic radiation. Other exposure methods may be maskless exposure methods. Exposure to light may decompose the photoacid generator, which generates acid and results in a latent acid image (defined at least in part by "latent image lines") in the resist resin. After exposure, the substrate may be heated in a post-exposure bake process. During the post-exposure bake process, the acid generated by the photoacid generator reacts with the resist resin in the photoresist layer, changing the solubility of the resist of the photoresist layer during the subsequent development process.

Figure 1:
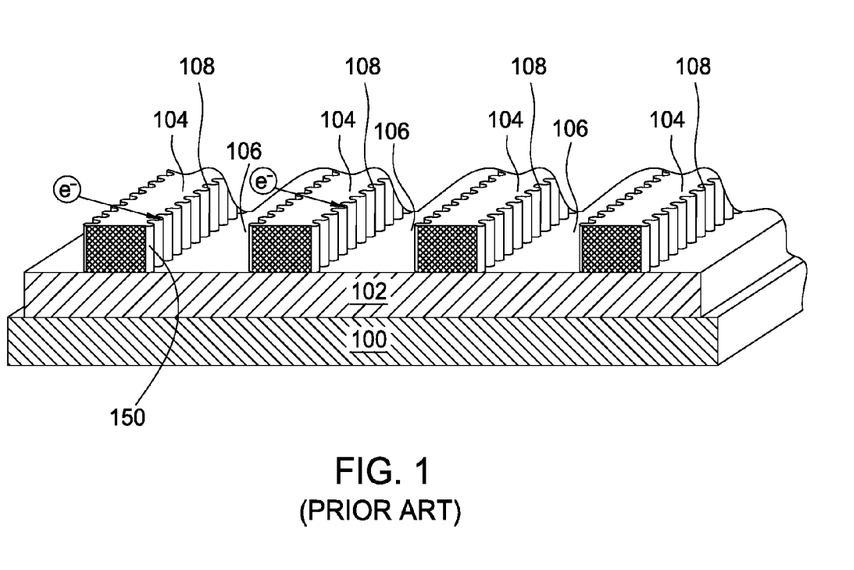
FIG. 1 depicts a top view of an exemplary structure of a patterned photoresist layer disposed on a substrate conventionally in the art.

After the post-exposure bake, the substrate, and, particularly, the photoresist layer may be developed and rinsed. After development and rinsing, a patterned photoresist layer is then formed on the substrate, as shown in FIG. 1. FIG. 1 depicts an exemplary top sectional view of the substrate 100 having the patterned photoresist layer 104 disposed on a target material 102 to be etched. Openings 106 are defined between the patterned photoresist layer 104, after the development and rinse processes, exposing the underlying target material 102 for etching to transfer features onto the target material 102. However, inaccurate control or low resolution of the lithography exposure process may result in the photoresist layer 104 having being formed with undesirable dimensions, such as unacceptable line width roughness (LWR) 108. Furthermore, during the exposure process, acid generated from the photoacid generator may diffuse randomly, including into regions under the mask where such acid is not intended to be diffused. This unintended diffusion may create undesired wiggling and/or an undesired roughness profile 150 at the interface of the patterned photoresist layer 104 with the openings 106. Large line width roughness (LWR) 108 and undesired wiggling profile 150 of the photoresist layer 104 may result in inaccurate feature transfer to the target material 102, which may lead to device failure and/or yield loss.

Therefore, there is a need for a method and an apparatus to control line width roughness (LWR) so as to obtain a patterned photoresist layer with desired dimensions. There is also a need for a method and an apparatus to control and reduce line edge/width roughness.

SUMMARY

A method of processing a substrate is disclosed herein. The method includes applying a photoresist layer comprising a photoacid generator to a substrate, wherein a first portion of the photoresist layer has been exposed unprotected by a photomask to a radiation light in a lithographic exposure process. The method also includes applying an electric field to alter movement of photoacid generated from the photoacid generator substantially in a vertical (or parallel) direction, wherein the electric field is applied by a first alternating pair of a positive voltage electrode and a negative voltage electrode and a second alternating pair of a positive voltage electrode and a negative voltage electrode.

A processing chamber for processing a substrate is disclosed herein. The processing chamber includes a supporting assembly with a surface for supporting a substrate. The processing chamber also includes a first electrode assembly comprising a first antenna and a second antenna positioned above the surface of the supporting assembly. The processing chamber also includes a second electrode assembly comprising a third antenna and a fourth antenna positioned below the surface of the supporting assembly. The processing chamber also includes a first power source coupled to the first electrode assembly and configured to provide the first electrode assembly with a positive voltage. The processing chamber also includes a second power source coupled to the second electrode assembly and configured to provide the second electrode assembly with a negative voltage.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods and apparatuses for controlling line edge/width roughness in lines formed by photolithography are provided. The random diffusion of acid generated by a photoacid generator during a post-exposure bake procedure contributes to line edge/width roughness which may be mitigated utilizing the techniques disclosed herein. Methods disclosed herein apply an electric field to a substrate on which the photoresist layer is disposed during a post-exposure bake step of a photolithography processes. Application of the electric field as described herein controls the diffusion and distribution of the acids generated by the photoacid generator, preventing the line edge/width roughness that results from random diffusion. Apparatuses and methods for performing the above-mentioned techniques are disclosed herein.

Figure 2:
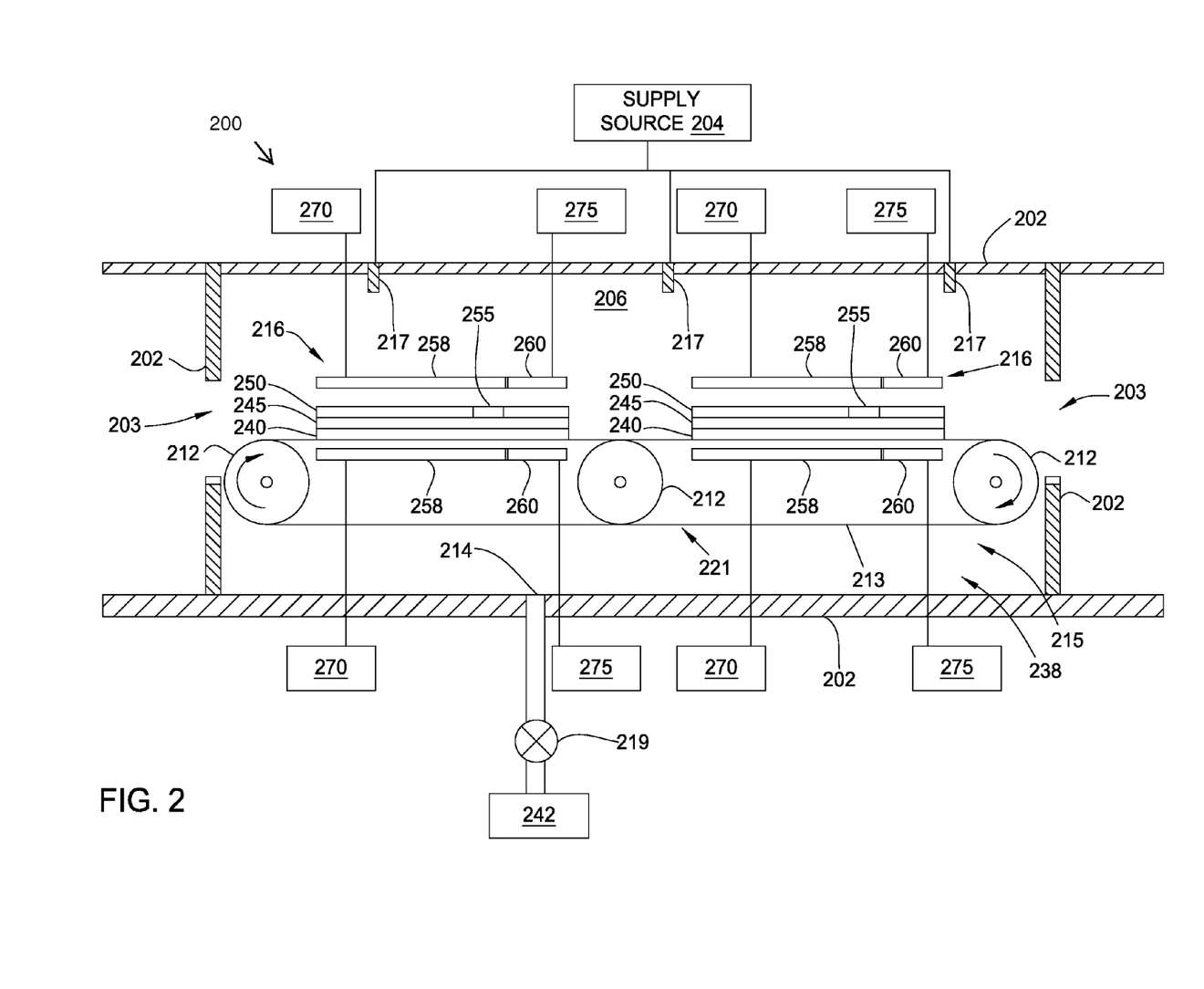
FIG. 2 is a schematic cross-sectional view of an apparatus for applying an electric field to a substrate on which a photoresist layer is disposed during a post-exposure bake process, according to an example.

FIG. 2 is a side view of one embodiment of a processing chamber 200 in which a post-exposure bake procedure may be performed with an electric field applied to a substrate 240 in accordance with one example. As described above, this post-exposure bake procedure is performed after an exposure stage of a photolithography process, in which a photoresist layer on the substrate 240 is exposed to electromagnetic radiation. More specifically, in the exposure stage a photoresist layer is formed on a substrate 240. The photoresist may include a resist resin and a photoacid generator. A mask or other mechanism is used to selectively expose the photoresist layer to electromagnetic radiation. The mask causes a latent pattern to form in the photoresist layer, where the layout of the latent pattern is dependent on the layout of the mask. The latent pattern is characterized by a change in the chemical properties of the photoresist layer such that subsequent stages can selectively remove desired portions of the photoresist layer. The post-exposure bake process is performed after the exposure stage and consists of applying heat to the photoresist layer to cause further changes to the chemical properties of the photoresist layer such that a subsequent development stage will selectively remove desired portions of the photoresist. The techniques disclosed herein include applying an electric field having a specified configuration during the post-exposure bake process such that a subsequent development stage will remove portions of the photoresist in way that edges at the interface between removed and unremoved portions of the photoresist remain smoother than if the electric field were not applied.

The substrate 240 on which the photoresist is disposed may be any type of substrate, such as a dielectric substrate, a glass substrate, a semiconductor substrate, or a conductive substrate. The substrate 240 may have a material layer 245 disposed thereon. The material layer 245 may be any desired layer. In other embodiments, the substrate 240 may have more than one material layer 245. The substrate 240 also has the photoresist layer 250 disposed over the material layer 245. When the post-exposure bake process is conducted, the substrate 240 has been previously exposed to electromagnetic radiation in an exposure stage of a photolithography process. The photoresist layer 250 thus has latent image lines 255, which define a latent image of electromagnetically-altered photoresist, formed therein from the exposure stage. The latent image lines 255 may be substantially parallel to each other. In other embodiments, the some or none of latent image lines 255 may be substantially parallel to each other.

The processing chamber 200 includes a substrate support assembly 238 that includes a substrate automation system 215 with a belt 213, moved via rollers 212, for supporting and moving the substrate 240. The processing chamber 200 may receive a linear array of substrates 240 through apertures 203 in the sides of the processing chamber 200. The processing chamber 200 includes one or more electrode assemblies 216 configured to provide an electric field to the substrates 240 as the substrates 240 are being processed in the processing chamber 200 for the post-exposure bake process. The processing chamber 200 also includes a heating mechanism (discussed below) to apply heat to the substrate 240 while the electric field is applied for the post-exposure bake process.

The electrode assembly 216 includes at least a first electrode 258 and a second electrode 260. In some embodiments the electrode assembly 216 is coupled to one or more walls 202 by a fixed stem (not shown). As shown, the first electrode 258 is coupled to a power source 270, and the second electrode 260 is coupled to a power supply 275. Electrode assemblies 216 are provided both above the belt 213 and below the belt 213 (and thus both above and below substrates 240 provided on the belt) in order to provide a desired electric field configuration. The specific configuration of the electrode assembly 216 is discussed in further detail below with respect to FIGS. 3A-3F and 5.

The substrate 240 is electrically floating. Thus, the substrate 240 is not electrically coupled to any conductive elements of the processing chamber 200 or to a ground. The processing chamber 200 may include one or more features to electrically float the substrate 240. In one example, the belt 213 has an electrically insulating material disposed on a top surface of the belt 213. The substrate 240 is placed on the electrically insulating material on the belt 213 in order to electrically insulate and float the substrate 240 placed on top of the belt 213. In another example, the substrate 240 is disposed on the belt, which is electrically isolated from other components of the processing chamber 200. In yet another example, the processing chamber 200 includes an arm or other mechanism upon which the substrate 240 is disposed. The arm or other mechanism is electrically floating. Electrically floating the substrate 240 helps to shape the electrical field applied by electrode assembly 216 into a desired configuration. More specifically, electrically floating the substrate 240 helps to shape an electric field into a configuration in which the electric field lines remain substantially parallel to the top (and/or bottom) surface of the substrate 240, which surface is generally parallel to the surface of the belt 213.

The processing chamber 200 may include one or more heating sources (also referred to herein as "heating mechanisms") to provide heat to the photoresist layer 250 during the post-exposure bake process. One example of the heating mechanism includes one or more heat lamps positioned within or outside the processing chamber 200. In another example of the heating mechanism, one or more lasers may be used to heat a photoresist layer 250 (or other layer) positioned on the substrate 240. In a further example of the heating mechanism, the supply source 204 may be configured to provide heated gas to the processing chamber 200 in order to heat the photoresist layer 250. In yet another example of the heating mechanism, a microwave heater may be used to heat a photoresist layer 250. In still another example of the heating mechanism, instead of using a belt 213, the substrate 240 may instead be supported by an arm that is heated and thus conductively transfers that heat to the photoresist layer 250. In such embodiments, the arm may be electrically floating or a surface of the arm that supports the substrate 240 may include an electrically insulating layer to cause the substrate 240 to be electrically floating.

Together, the configuration of the electrode assemblies 216 and the fact that the substrate 240 is electrically floating helps to generate a desired electric field configuration. More specifically, the electrode assembly 216 is configured to generate an electric field parallel to the x-y plane defined by the surface of the belt 213. The electrical floating of the substrate 240 helps to cause the electric field to be substantially parallel to the surface of the substrate 240 along a substantially large portion of the substrate 240. Moving the substrate 240 via the belt 213 through the processing chamber while the electric field and heat is applied helps to cause the charged species 355 (shown in FIG. 3A) to move in a desired direction, allowing the interfaces defined by the latent image to be smoother than if no electric field were applied. These charged species may represent the acids described above that are present in the photoresist layer. These acids may be charged, and thus an electric field may affect motion of these charged species 355.

When applying the electric field and heating the substrate 240, the processing chamber 200 may be filled with a non-reactive gas or with a vacuum during the post-exposure bake process. The processing chamber 200 is enclosed by a set of walls 202. The walls 202 generally comprise a material that can structurally support the loads applied by the external environment, which is external to the processing region 206, when the processing region 206 is heated to a desirable temperature and pumped to a vacuum pressure by a vacuum pump 242 or filled with any desirable gas. The walls 202 may thus comprise a material such as an aluminum material or stainless steel.

The apertures 203 may be sealed with a sealing mechanism, such as a slideable panel, when the post-exposure bake process is performed to allow a vacuum to be generated in the interior of the processing chamber 200. A vacuum port 214 may be present in any of the walls 202 (e.g., front, back, top, bottom, left, right) to allow a vacuum pump 242 to pull vacuum via valve 219. The vacuum pump 242 may reduce the pressure of within the processing chamber 200 and exhaust any gases and/or process by-products out of the processing chamber 200. Gas inlets 217 allow a supply source 204 to provide gases to the interior of the processing chamber 200.

In the configuration shown in FIG. 2, the substrate automation system 215 comprises a conveyor 221 that is adapted to support and guide substrates 240 through the processing chamber 200 by use of one or more actuators (not shown), for example, a stepper motor or servo motor. In one configuration, the conveyor 221 comprises two or more rollers 212 and a belt 213 that are configured to support and move the substrates 240 through the processing chamber 200. In various embodiments, the processing chamber 200 may comprise different types of processing chambers. For example, instead of a processing chamber with conveyor belt, the processing chamber 200 may be an independent processing chamber. Alternatively, the processing chamber 200 may be part of a processing system, such as, for example, an in-line processing system, a cluster processing system, or the track processing system as desired.

The power source 270 and the power supply 275 may have various characteristics in order to provide the electric field described above. For example, the power source 270 and the power supply 275 may be configured to supply between about 500 V and about 100 kV to the electrode assembly 216, to generate an electric field having a strength between about 0.1 MV/m and about 100 MV/m. In some embodiments, either or both of the power source 270 or the power supply 275 are a pulsed direct current (DC) power supply. The pulsed DC wave may be from a half-wave rectifier or a full-wave rectifier. The DC power may have a frequency of between about 10 Hz and 1 MHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, either or both of the power source 270 and the power supply 275 are an alternating current power supply. The waveform applied by such an alternating current power supply may be a sinusoidal waveform. The frequency of such a sinusoidal waveform may be from between 1 Hz to 1 KHz, although the frequency is not limited to those numbers. This AC waveform may be combined with a pulse, as well. In other embodiments, either or both of the power source 270 and the power supply 275 are a direct current power supply. In some embodiments, either or both of the power source 270 and the power supply 275 may use a DC offset. The DC offset may be, for example, between about 0% and about 75% of the applied voltage, such as between about 5% and about 60% of the applied voltage.

Figure 3A:
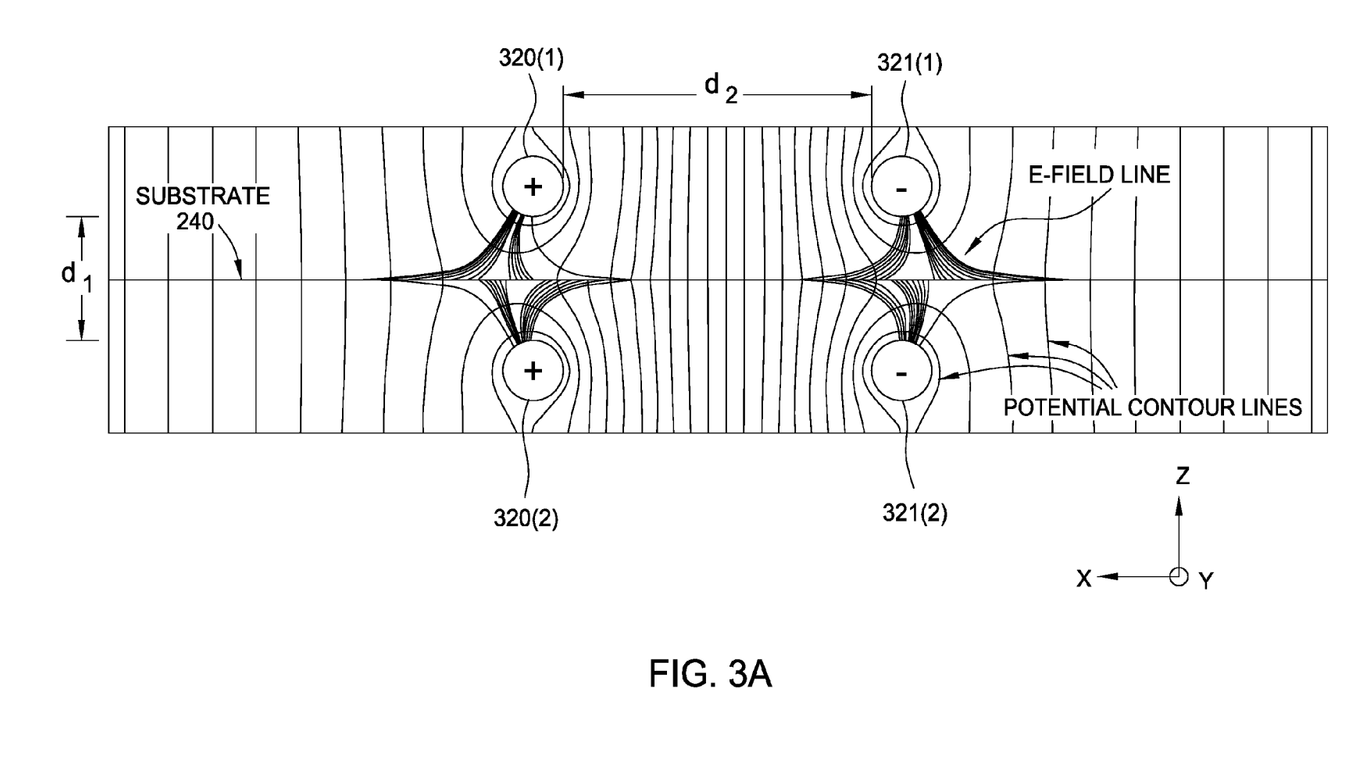
FIG. 3A is a side view of pairs of antennas above and below a substrate that includes a photoresist layer, for applying an electric field to the photoresist layer during a post-exposure bake process, according to an example.

FIG. 3A is a side view of pairs of antennas 320, 321 above and below a substrate 240 that includes a photoresist layer 250 (shown in FIG. 2). Electrode assembly 216 (FIG. 2), which are present above and below substrate 240, include the antennas 320, 321 illustrated in FIG. 3A. The antennas 320, 321 are configured to provide an electric field to the photoresist layer 250 as described above. FIG. 3A shows an example configuration of the electric field that is produced by the antennas 320, 321.

As shown, an antenna 320(1) having a positive voltage is present in the space above the substrate 240 and an antenna 320(2) having substantially the same voltage as the antenna 320(1) is present in the space below the substrate. Antenna 320(1) is spaced apart from antenna 320(2) by distance $d_1$. Also, an antenna 321(1) is present above the substrate 240 and is spaced apart from antenna 320(1) by distance $d_2$. Antenna 321(2) is present below the substrate 240 and is spaced apart from antenna 321(2) by $d_1$ and from antenna 320(2) by $d_2$. Antenna 321(1) and antenna 321(2) have a negative voltage as compared with antenna 320(1) and 320(2). Antenna 321(1) and antenna 321(2) have substantially the same voltage. This configuration, in which two vertically aligned, "positive" antennas and two vertically aligned, "negative" antennas are present above and below the photoresist 250, forms an electric field with desirable characteristics, in which the electric field is parallel to the surface of the photoresist 250.

When the substrate 240, with photoresist 250, is heated in the presence of an electric field generated by the antennas 320, 321 present both above and below the substrate 240, as shown in FIGS. 2 and 3A, a uniformity of directional movement is applied to the charged species 355. The uniform directional movement of the charged species 355 is shown by the double headed arrow 370 in FIG. 3. In contrast, when the above technique is not utilized, the charged species 355 and polarized species may move randomly, as shown by the arrows 370'.

For clarity, in FIG. 3A, only two pairs of antennas 320, 321 are shown. However, those of skill in the art will understand that additional antennas 320, 321 may be present in processing chamber as well. For example, additional antennas 320, 321 in horizontal alignment may be present, as illustrated in FIG. 3C. Additionally, additional stacked antennas 320, 321 in vertical alignment may be present, as illustrated in FIG. 3B.

Figure 3B:
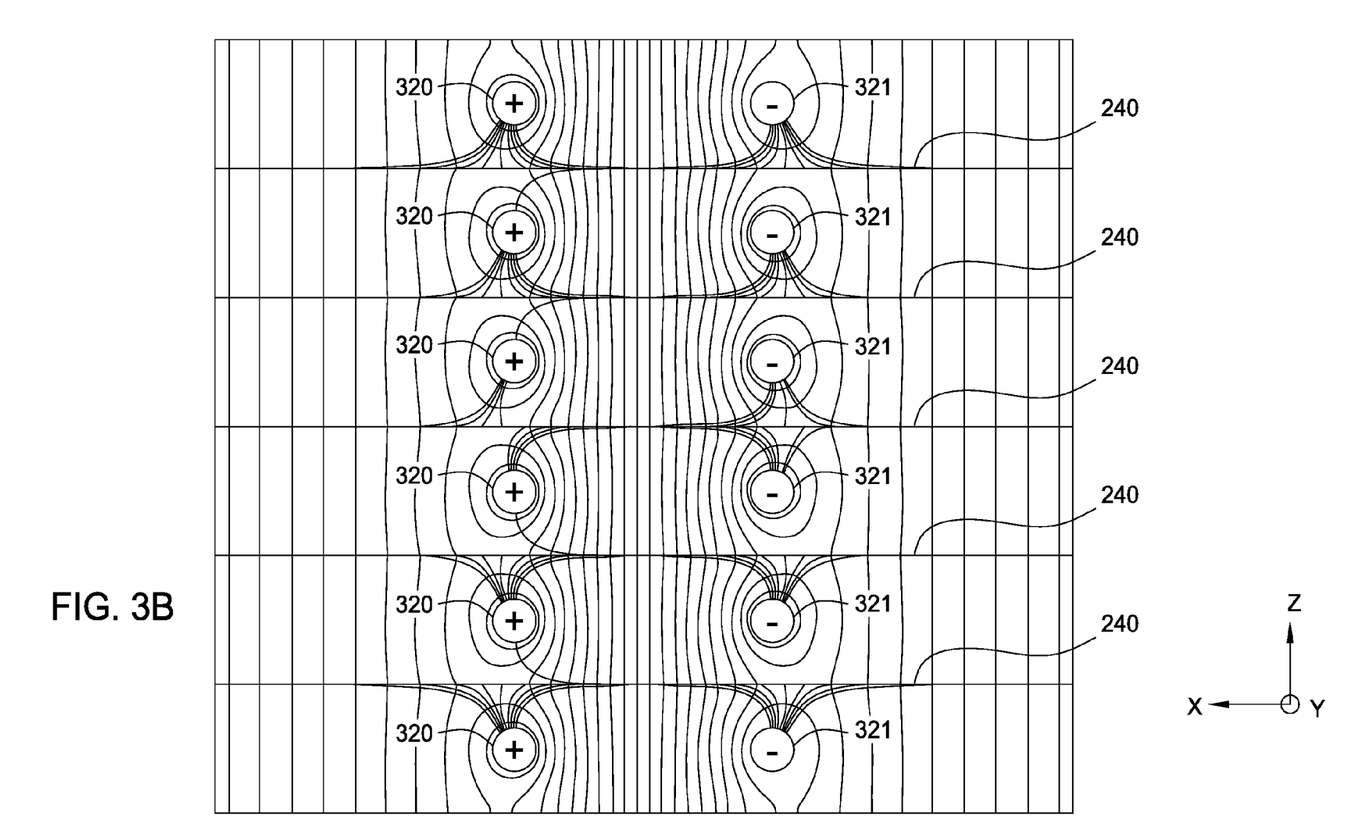
FIG. 3B is a side view of stacked pairs of antennas for processing multiple substrates that include photoresist layers, according to an example.
Figure 3C:
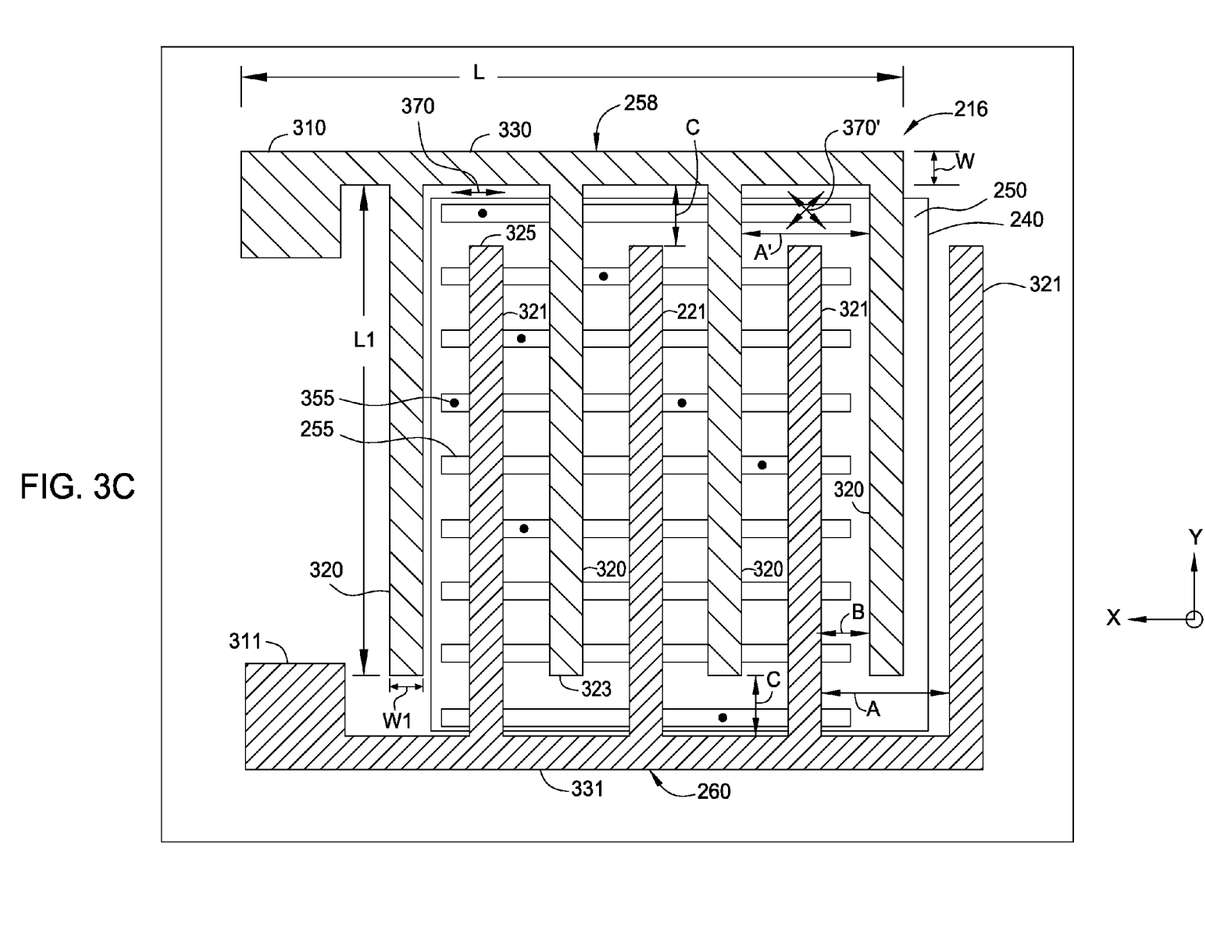
FIG. 3C is a top view of an electrode assembly that includes the antennas of FIG. 3A, for applying an electric field to the photoresist layer during a post-exposure bake process, according to an example.

FIG. 3B is a side view of a series of antennas 320, 321 arranged in a stacked configuration. In order to support additional processing throughput, the electrode assemblies 216 of FIG. 2 can be stacked. A substrate 240 with photoresist layer 250 may be disposed between each pair of antenna 320 and antenna 321 and may be scanned in a horizontal direction while heated in order to perform the post-exposure bake procedure described above. The configuration of the electric field is substantially the same for each substrate 240 as described above with respect to FIG. 3A.

FIG. 3C is a top-down view of the electrode assembly 216 that include the antennas 320, 321, according to an example. While a specific configuration of electrode assembly 216 that includes antennas 320, 321 is illustrated in FIG. 3C, those of skill in the art will understand that other configurations including antennas 320, 321 configured as shown in FIG. 3A are possible as well.

The electrode assembly 216 shown in FIG. 3C includes at least the first electrode 258 and the second electrode 260. The first electrode 258 includes a first terminal 310, a first support structure 330, and one or more antennas 320. The second electrode 260 includes a second terminal 311, a second support structure 331, and one or more antennas 321. The first terminal 310, the first support structure 330, and the one or more antennas 320 of the first electrode 258 may form a unitary body. Alternatively, the first electrode 258 may include separate portions that may be coupled together. For example, the one or more antennas 320 may be detachable from the first support structure 330. The second electrode 260 may similarly be a unitary body or be comprised of separate detachable components. The first electrode 258 and the second electrode 260 may be prepared by any suitable means. For example, the first electrode 258 and the second electrode 260 may be fabricated by machining, casting, or additive manufacturing.

The first support structure 330 may be made from a conductive material, such as metal. For example, the first support structure 330 may be made of silicon, polysilicon, silicon carbide, molybdenum, aluminum, copper, graphite, silver, platinum, gold, palladium, zinc, other materials, or mixtures thereof. The first support structure 330 may have any desired dimensions. For example, the length L of the first support structure 330 may be between about 25 mm and about 450 mm, for example, between about 100 mm and about 300 mm. In some embodiments, the first support structure 330 has a length L approximately equal to a diameter of a standard semiconductor substrate. In other embodiments, the first support structure 330 has a length L that is larger or smaller than the diameter of a standard semiconductor substrate. For example, in different representative embodiments, the length L of the first support structure 330 may be about 25 mm, about 51 mm, about 76 mm, about 100 mm, about 150 mm, about 200 mm, about 300 mm, or about 450 mm. The width W of the first support structure 330 may be between about 2 mm and about 25 mm. In other embodiments, the width W of the first support structure 330 is less than about 2 mm. In other embodiments, the width W of the first support structure 330 is greater than about 25 mm. The thickness of the first support structure 330 may be between about 1 mm and about 10 mm, such as between about 2 mm and about 8 mm, such as about 5 mm. In some embodiments, the first support structure 330 may be square, cylindrical, rectangular, oval, rods, or other shapes. Embodiments having round exterior surfaces may avoid arcing.

The support structure 330 may be made of the same materials as the second support structure 331. The range of dimensions suitable for the first support structure 330 is also suitable for the second support structure 331. In some embodiments, the first support structure 330 and the second support structure 331 are made of the same material. In other embodiments, the first support structure 330 and the second support structure 331 are made of different materials. The lengths L, widths W, and thicknesses of the first support structure 330 and the second support structure 331 may be the same or different.

The one or more antennas 320 of the first electrode 258 may also be made from a conductive material. The one or more antennas 320 may be made from the same materials as the first support structure 330. The one or more antennas 320 of the first electrode 258 may have any desired dimensions. For example, a length L1 of the one or more antennas 320 may be between about 25 mm and about 450 mm, for example, between about 100 mm and about 300 mm. In some embodiments, the first support structure 330 has a length L1 approximately equal to the diameter of a standard substrate. In other embodiments, the length L1 of the one or more antennas 320 may be between about 75% and 90% of the diameter of a standard substrate. A width W1 of the one or more antennas 320 may be between about 2 mm and about 25 mm. In other embodiments, the width W1 of the one or more antennas 320 is less than about 2 mm. In other embodiments, the width W1 of the one or more antennas 320 is greater than about 25 mm. The thickness of the one or more antennas 320 may be between about 1 mm and about 10 mm, such as between about 2 mm and about 8 mm. The one or more antennas 320 may have a cross-section that is square, rectangular, oval, circular, cylindrical, or another shape. Embodiments having round exterior surfaces may avoid arcing.

Each of the antennas 320 may have the same dimensions. Alternatively, some of the one or more antennas 320 may have different dimensions than one or more of the other antennas 320. For example, some of the one or more antennas 320 may have different lengths L1 than one or more of the other antennas 320. Each of the one or more antennas 320 may be made of the same material. In other embodiments, some of the antennas 320 may be made of a different material than other antennas 320.

The antennas 321 may be made of the same range of materials as the antennas 320. The range of dimensions suitable for the antennas 320 is also suitable for the antennas 321. In some embodiments, the antennas 320 and the antennas 321 are made of the same material. In other embodiments, the antennas 320 and the antennas 321 are made of different materials. The lengths L1, widths W1, and thicknesses of the antennas 320 and the antennas 321 may be the same or different.

The antennas 320 may include between 1 and about 40 antennas 320. For example, the antennas 320 may include between about 4 and about 40 antennas 320, such as between about 10 and about 20 antennas 320. In other embodiments, the antennas 320 may include more than 40 antennas 320. In some embodiments, each of the antennas 320 may be substantially perpendicular to the first support structure 330. For example, in embodiments where the first support structure 330 is straight, each antenna 320 may be substantially parallel to the first support structure 330. Each of the antennas 320 may be substantially parallel to each of the other antennas 320. Each of the antennas 321 may be similarly positioned with respect to the support structure 331 and each other antenna 321.

Each of the antennas 320 has a terminal end 323. Each of the antennas 321 has a terminal end 325. A distance C is defined between the first support structure 330 and the terminal end 325. A distance C' is defined between the second support structure 331 and the terminal end 323. Each of the distances C and C' may be between about 1 mm and about 10 mm. In other embodiments, the distances C and C' may be less than about 1 mm or greater than about 10 mm. In some embodiments, the distance C and the distance C' are equal. In other embodiments, the distance C and the distance C' are different.

A distance A is defined between facing surfaces of one of the antennas 321 and an adjacent one of the antennas 321. The distance A' is defined between facing surfaces of one antenna 320 and an adjacent one the antennas 320. The distances A and A' may be greater than about 6 mm. For example, the distances A and A' may be between about 6 mm and about 20 mm, such as between about 10 mm and about 15 mm. The distances A and A' between each adjacent antennas 321, 320 may be the same or different. For example, the distances A' between the first and second, second and third, and third and fourth antennas of the one or more antennas 320 may be different. In other embodiments, the distances A' may be the same.

A distance B is defined between facing surfaces of one of the antennas 320 and an adjacent one of the antennas 321. The distance B may be, for example, greater than about 1 mm. For example, the distance B may be between about 2 mm and about 10 mm, such as between about 4 mm and about 6 mm. The distance B defined between may be the same, each distance B may be different, or some distances B may be the same and some distances B may be different. Modifying the distance B allows for easy control of the electric field strength.

The antennas 320, 321 may be oriented in an alternating arrangement above the photoresist layer 250 and below. For example, the antennas 320 of the first electrode 258 and the antennas 321 of the second electrode 260 may be positioned such that at least one of the antennas 320 is positioned between two of the antennas 321. Additionally, at least one antenna 321 may be positioned between two of the antennas 320. In some embodiments, all but one of the antennas 320 is positioned between two of the antennas 321. In those embodiments, all but one of the antennas 321 may be positioned between two of the antennas 320. In some embodiments, the antennas 320 and the antennas 321 may each have only one antenna.

In some embodiments, the first electrode 258 has a first terminal 310, and the second electrode 260 has a second terminal 311. The first terminal 310 may be a contact between the first electrode 258 and the power source 270, the power supply 275, or a ground. The second terminal 311 may be a contact between the second electrode 260 and the power source 270, the power supply 275, or a ground. The first terminal 310 and the second terminal 311 are shown as being at one end of the first electrode 258 and the second electrode 260, respectively. In other embodiments, the first terminal 310 and the second terminal 311 may be positioned at other locations on the first electrode 258 and the second electrode, respectively. The first terminal 310 and the second terminal 311 have different shapes and sizes than the first support structure 330 and the support structure 331, respectively. In other embodiments, the first terminal 310 and the second terminal 311 may have generally the same shapes and sizes as the first support structure 330 and the support structure 331, respectively.

In operation, a voltage may be supplied from a power supply, such as the power source 270 or the power supply 275, to the first terminal 310 or the second terminal 311. The supplied voltage creates an electric field between each antenna of the one or more antennas 320 and each antenna of the one or more antennas 321. The electric field will be strongest between an antenna of the one or more antennas 320 and an adjacent antenna of the one or more antennas 321. The interleaved and aligned spatial relationship of the antennas 320, 321 produces an electric field predominantly in a direction parallel to the plane defined by the surface of the belt 213. The substrate 240 is positioned on the belt 213 such that the latent image lines 255 are parallel to the electric field lines generated by the electrode assembly 216. Since the charged species 355 are charged, the charged species 355 are affected by the electric field. The electric field drives the charged species 355 generated by the photoacid generators in the photoresist layer 250 in the direction of the electric field. By driving the charged species 355 in a direction parallel with the latent image lines 255, line edge roughness may be reduced. The uniform directional movement is shown by the double headed arrow 370. In contrast, when a voltage is not applied to the first terminal 310 or the second terminal 311, an electric field is not created to drive the charged species 355 in any particular direction. As a result, the charged species 355 may move randomly, as shown by the arrows 370', which results in increased line edge roughness.

Figure 3D:
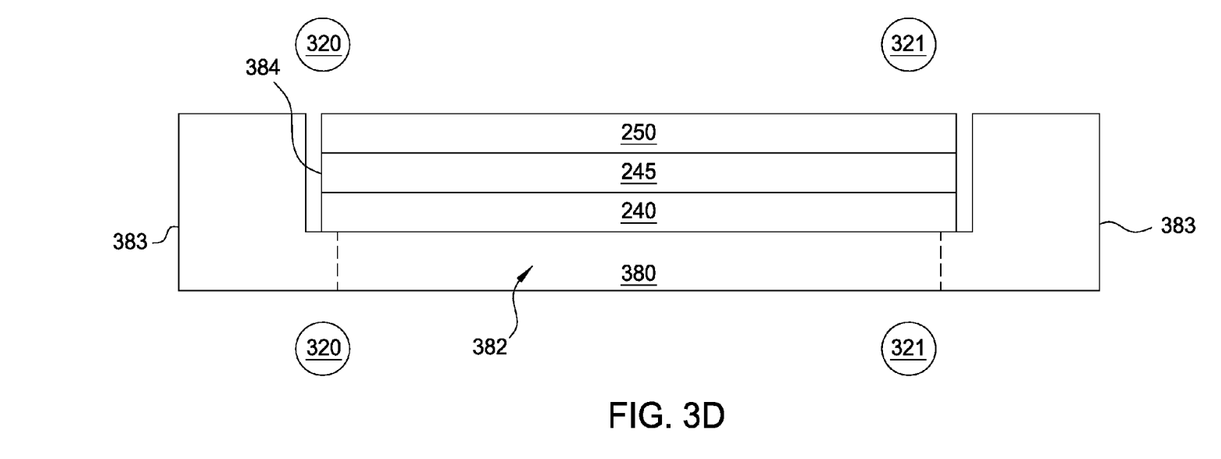
FIGS. 3D-3F illustrate examples of substrate holders for reducing electric field distortion while an electric field is applied to the photoresist layer during a post-exposure bake process.
Figure 3E:
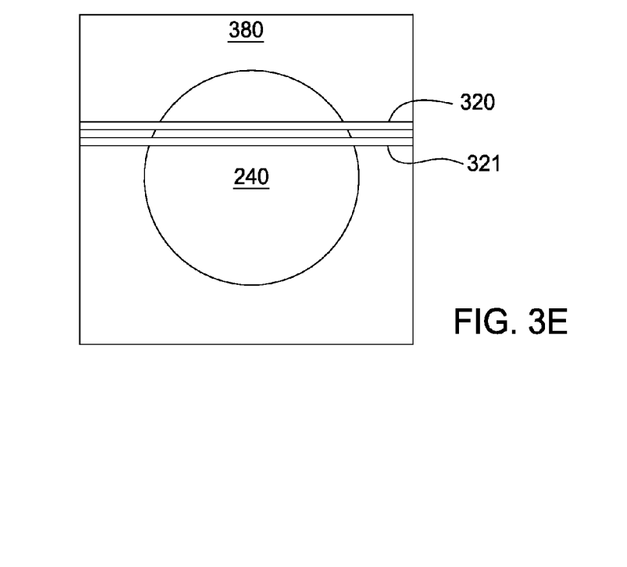
Figure 3F:
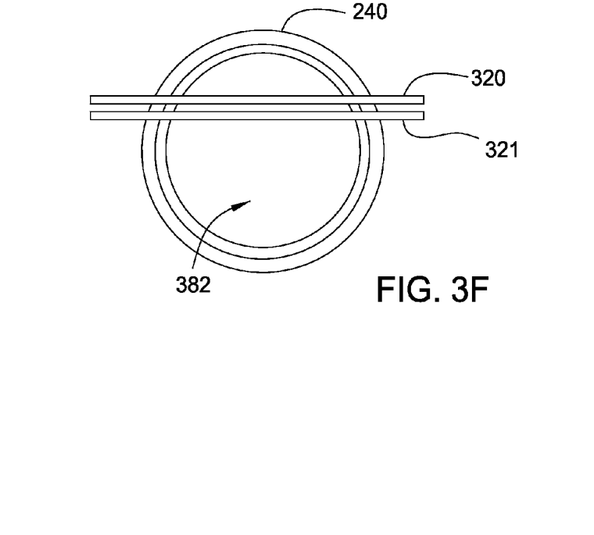

FIG. 3D is a side view of a configuration for a holder 380 for holding the substrate 240, according to an example. Without holder 380, the outer edge 384 of the substrate 240 and layers applied on top of the substrate act as a boundary between materials with differing dielectric constants (e.g., the material of the substrate 240 and layers as opposed to air, vacuum, or other gas within processing chamber 200). These differing dielectric constants may cause the electric field near the edge of the substrate 240 to be distorted. A holder 380 is therefore placed under substrate 240 in order to prevent field distortion. The holder 380 is generally of a material that has a similar dielectric constant to the material of the substrate 240 and layers above the substrate. One example of such a material is quartz. The holder 380 is also configured such that the area surrounding the substrate 240 and other layers has a dielectric constant that is similar to the dielectric constant of the substrate and other layers. Thus, the holder 380 may be configured such that walls 383 of the holder sound the entire height of the substrate 240 and layers above the substrate. A bottom portion 382 of the holder 380 may include a cut-out portion indicated with dotted-lines (i.e., in some embodiments, cutout portion 382 may be absent from holder 380). The uniformity of dielectric constant reduces the amount of distortion experienced by the substrate 240 and layers above. FIG. 3E illustrates an example of a holder 380 that has a square shape and FIG. 3F illustrates an example holder that has a ring shape with a central cutout portion 382.

Figure 4A:
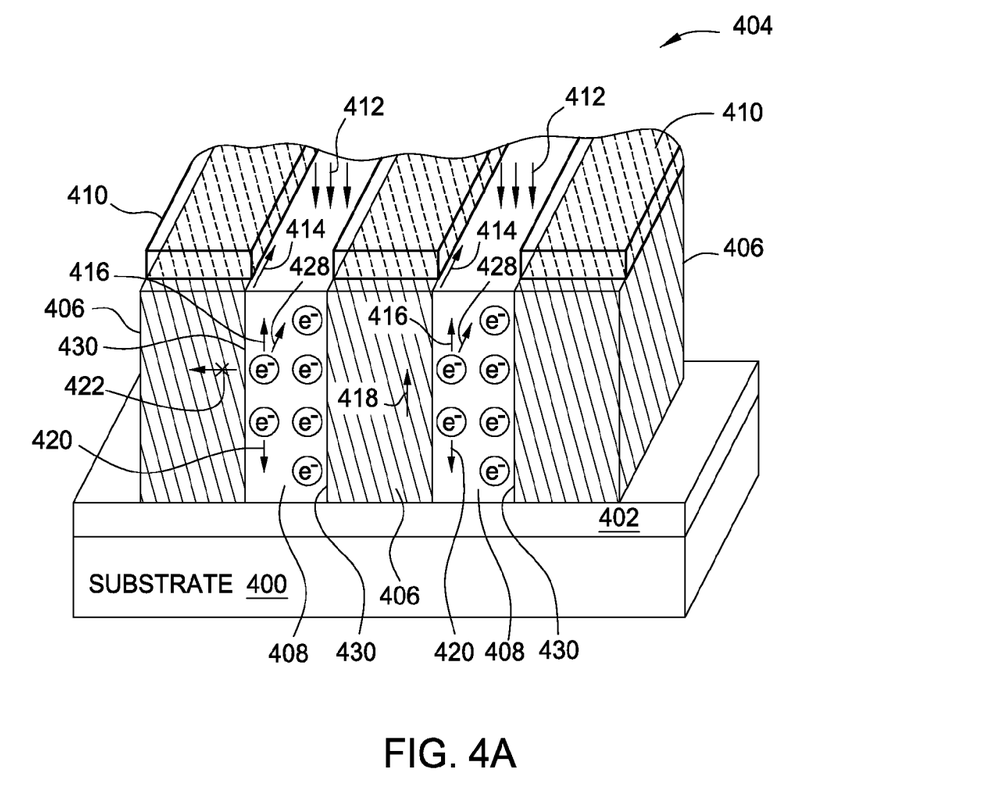
FIG. 4A-4B depict an acid distribution control of a photoresist layer during an exposure process.

FIG. 4A depicts a photoresist layer 404 disposed on a material layer 402 formed on a substrate 400 during a lithography exposure process. As discussed above, an electric field from the electrode assembly 216 is applied during a post exposure baking process. During the lithographic exposure process, radiation 412 is directed to a first region 408 of the photoresist layer 404 while with a second region 406 of the photoresist layer 404 protected by a photomask 410. Photoacid, shown as e⁻ in FIG. 4A, is generated in the exposed first region 408 in the photoresist layer 404 when photoacid generator (PAG) is exposed to the radiation 412, such as a ultraviolet (UV) radiation. Although FIG. 4A illustrates the photoacid with an "e⁻" symbol, this is not specifically reflective of the actual charge of photoacid compounds—but of the fact that photoacide compounds generally are electrically charged.

In a conventional process, photoacid is primarily generated in the exposed first region 408 of the photoresist layer 404 during the light exposure process. During the post-exposure bake period, movement of photoacid is generally random and the interface between areas within the photoresist layer 404 that include the generated photoacid and areas that do not include the generated photoacid may comprise an unclear boundary (i.e., interface 430). For example, the random movement may result in at least a portion of the photoacid diffusing into the second region 406, as shown in the arrow 422. Such photoacid drift may result in line edge roughness, resolution loss, photoresist footing, and profile deformation, which may cause inaccurate transfer of features to the underlying material layer 402. This inaccurate transfer of features could lead to device failure.

By applying the electric field described above to the photoresist layer 404 during the post-exposure bake process, distribution of photoacid in the exposed first region 408 may be efficiently controlled and confined. The electric field as applied to the photoresist layer 404 may move photoacid in vertical directions (e.g., the y-direction shown by arrows 416 and 420, which is substantially perpendicular to the planar surface of the substrate 400) with minimal lateral motion (e.g., x direction shown by the arrow 422). (Note that for completeness, direction 414 and associated direction 428 are shown). That is, the photoacid generally does not diffuse into the adjacent second region 406. Generally, photoacid has a certain polarity that may be affected by an electric field applied thereto. Such an applied electric field will orient photoacid molecules in directions that are in accordance with the electric field. When such electric field is applied, the photoacid moves in a desired direction such that the photoacid generally does not cross into the second region 406.

Figure 4B:
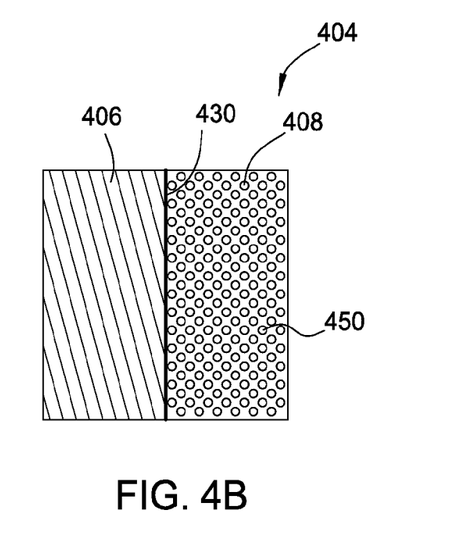

FIG. 4B depicts a top view of the photoresist layer 404 including a portion of the first region 408 and the second region 406 delineated by the interface 430. After the electric and/or magnetic field is applied to the photoresist layer 450, distribution of photoacid 450 is generally constrained to the first region 408 without diffusing cross to the second region 406. Thus, by applying the electric field and/or magnetic field as described above, a clearly defined interface 430 may be obtained, thus forming a patterned photoresist layer with a sharp profile, a high resolution and reduced line edge roughness and defects.

Figure 5:
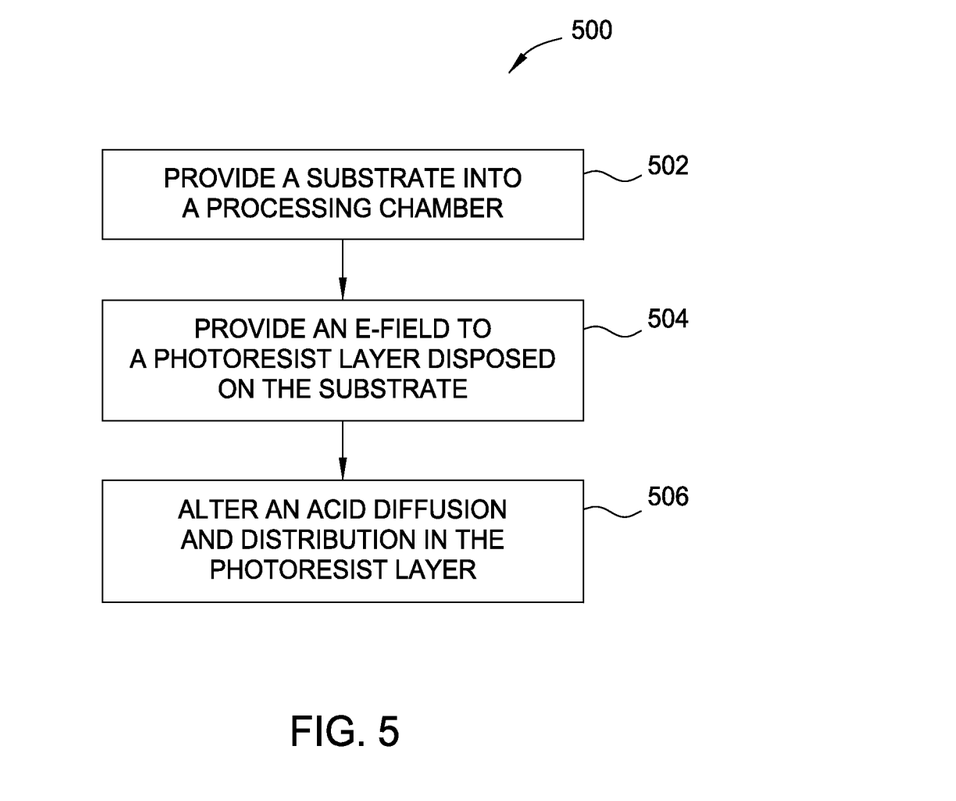
FIG. 5 is a flow diagram of one method of controlling acid distribution of a photoresist layer during a post-exposure bake process.

FIG. 5 depicts a flow diagram of a method 500 for controlling photoacid distribution/diffusion in a photoresist layer during a lithographic exposure process or during a prebaking process or a post-baking process. The method 500 begins at block 502 by positioning a substrate, such as the substrate 400 described above, into a processing chamber, such as the processing chamber 200 depicted in FIG. 2, with an electrode assembly and a magnetic assembly disposed therein. At block 504, after the substrate 400 is positioned in place, an electric field is applied to the processing chamber to control photoacid movement that occurrs in a photoresist layer disposed on the substrate. At block 506, after the electric field is applied to the photoresist layer disposed on the substrate, photoacid as generated may be moved primarily in a single plane, so as to reduce likelihood of photoacid diffusing into a region in which photoacid is not intended to be included. By utilizing directional control of photoacid distribution, a photoresist layer with a well-defined edge profile, having substantially no blurring, having high resolution, and having reduced line edge roughness may be obtained.

Although described above in the context of improving line edge roughness and line edge width, the techniques provided above may additionally be used to improve the sensitivity of photoresist. This sensitivity is associated with the reaction that makes the photoresist soluble. By applying the electromagnetic field techniques described above, the reaction that causes the photoresist to become soluble is sped up, which improves the sensitivity.

The previously described embodiments have many advantages, including the following. For example, the embodiments disclosed herein may reduce or eliminate line edge/width roughness with high resolution and sharp edge profile. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, the method comprising:
    applying a photoresist layer comprising a photoacid generator to a substrate, wherein a first portion of the photoresist layer has been exposed unprotected by a photomask to a radiation light in a lithographic exposure process; and applying an electric field to alter movement of photoacid generated from the photoacid generator substantially in a vertical direction, wherein the electric field is applied by a first alternating pair of a positive voltage electrode and a negative voltage electrode and a second alternating pair of a positive voltage electrode and a negative voltage electrode, and wherein applying the electric field further comprises:

charging a first antenna with a first voltage and a second antenna with a second voltage, the first antenna and the second antenna being disposed above the photoresist layer, and the first and the second voltages having opposite polarities; and charging a third antenna with a third voltage and a fourth antenna with a fourth voltage, the third antenna and the fourth antenna being disposed below the photoresist layer, and the third and the fourth voltages having opposite polarities.

2. The method of claim 1, further comprising:
electrically floating the substrate.

3. The method of claim 1, wherein the electric field is applied to the photoresist layer during a post-exposure bake process performed after the lithographic exposure process.

4. The method of claim 1, wherein applying the electric field further comprises:
controlling photoacid generated in the first portion of the photoresist layer in a longitudinal direction defined in a plane interfaced with a second portion of the photoresist layer protected by the photomask during the lithographic exposure process.

5. The method of claim 1 further comprising:
moving the substrate via a conveyor.

6. The method of claim 1, wherein the first voltage and the second voltage each comprises one of a direct current voltage, an alternating current voltage, or a pulse.

7. The method of claim 1 further comprising:
heating the photoresist layer.

8. The method of claim 1 further comprising:
placing the substrate in a holder with walls having a substantially similar dielectric constant to a dielectric constant of the substrate.

9. A processing chamber for processing a substrate, the processing chamber comprising:
a supporting assembly with a surface for supporting a substrate;
a first electrode assembly comprising a first antenna and a second antenna positioned above the surface of the supporting assembly;
a second electrode assembly comprising a third antenna and a fourth antenna positioned below the surface of the supporting assembly;
a first power source coupled to the first electrode assembly and configured to provide the first antenna with a first voltage and the second antenna with a second voltage, the first and second voltages having opposite polarities; and
a second power source coupled to the second electrode assembly and configured to provide the third antenna with a third voltage and the fourth antenna with a fourth voltage, the third and fourth voltages having opposite polarities.

10. The processing chamber of claim 9, further comprising:
an insulating layer disposed on the supporting assembly for electrically floating the substrate.

11. The processing chamber of claim 9, wherein first power source and second power source are configured to provide the positive voltage and negative voltage during a post-exposure bake process performed after the lithographic exposure process.

12. The processing chamber of claim 9, wherein the supporting assembly comprises a conveyor operable to position a substrate relative to the first antenna, the second antenna, the third antenna, and the fourth antenna.

13. The processing chamber of claim 9 further comprising:
a heating mechanism for applying heat to the photoresist layer.

14. The processing chamber of claim 9 further comprising:
a holder configured to support the substrate, wherein the holder has walls, the walls having a substantially similar dielectric constant to a dielectric constant of the substrate.

15. The processing chamber of claim 9, wherein the first antenna and the second antenna are interleaved, and the third antenna and the fourth antenna are interleaved.

* * * * *